(12) United States Patent
Park et al.

(10) Patent No.: US 9,391,301 B2
(45) Date of Patent: Jul. 12, 2016

(54) SUBSTRATE FOR ORGANIC ELECTRONIC DEVICE

(71) Applicant: LG CHEM, LTD., Seoul (KR)

(72) Inventors: Min Choon Park, Daejeon (KR); Se Hwan Son, Daejeon (KR); Yeon Keun Lee, Daejeon (KR); Yong Sik Ahn, Daejeon (KR); Jung Doo Kim, Daejeon (KR); Ji Hee Kim, Daejeon (KR); Sang Jun Park, Daejeon (KR); Yong Nam Kim, Daejeon (KR)

(73) Assignee: LG Chem, Ltd., Seoul (KR)

(*) Notice: Subject to any disclaimer, the term of this patent is extended or adjusted under 35 U.S.C. 154(b) by 0 days.

(21) Appl. No.: 14/606,759

(22) Filed: Jan. 27, 2015

(65) Prior Publication Data

US 2015/0137109 A1   May 21, 2015

Related U.S. Application Data

(63) Continuation of application No. PCT/KR2013/006909, filed on Jul. 31, 2013.

(30) Foreign Application Priority Data

Jul. 31, 2012  (KR) .................. 10-2012-0084211
Jul. 31, 2013  (KR) .................. 10-2013-0091010

(51) Int. Cl.
*H01L 27/146* (2006.01)
*H01L 51/52* (2006.01)
*H01L 51/00* (2006.01)
*G02B 5/02* (2006.01)

(52) U.S. Cl.
CPC ............. *H01L 51/5268* (2013.01); *G02B 5/02* (2013.01); *H01L 51/0096* (2013.01); Y02E 10/549 (2013.01); Y10T 428/24372 (2015.01); Y10T 428/24752 (2015.01); Y10T 428/249971 (2015.04); Y10T 428/25 (2015.01)

(58) Field of Classification Search
CPC ................... H01L 51/5268; H01L 2251/5376
USPC ........................ 257/258; 428/313.3
See application file for complete search history.

(56) References Cited

U.S. PATENT DOCUMENTS

| 4,720,432 A | 1/1988 | VanSlyke et al. |
| 5,612,128 A * | 3/1997 | Endo .................. C03C 17/007 428/206 |
| 5,909,314 A * | 6/1999 | Oka ........................ G02B 1/11 359/582 |
| 6,414,734 B1 * | 7/2002 | Shigeta ............ G02F 1/133502 349/113 |
| 2005/0030444 A1 * | 2/2005 | Fujiwara ........... G02F 1/133615 349/64 |
| 2007/0184260 A1 * | 8/2007 | Saito ...................... C08J 7/047 428/323 |

(Continued)

FOREIGN PATENT DOCUMENTS

| CN | 1638585 A | 7/2005 |
| JP | 02088689 | 3/1990 |

(Continued)

*Primary Examiner* — Caridad Everhart
(74) *Attorney, Agent, or Firm* — Dentons US LLP (57) ABSTRACT

Provided are a substrate for an organic electronic device (OED), an organic electronic system, and a light. The substrate capable of forming an OED ensuring excellent performances and reliability because it may have excellent performances including light extraction efficiency, permeation of moisture or a gas from an external environment may be inhibited, and growth of dark spots may be controlled may be provided.

15 Claims, 8 Drawing Sheets

(56) References Cited

U.S. PATENT DOCUMENTS

| | | | |
|---|---|---|---|
| 2007/0241668 A1* | 10/2007 | Ottermann | G02B 1/11 |
| | | | 313/504 |
| 2008/0286527 A1* | 11/2008 | Haga | G02B 5/0221 |
| | | | 428/143 |
| 2009/0128917 A1* | 5/2009 | Yoshinari | G02B 5/0226 |
| | | | 359/601 |
| 2010/0060142 A1 | 3/2010 | Itou et al. | |
| 2010/0225229 A1 | 9/2010 | Hosoda et al. | |
| 2012/0316265 A1* | 12/2012 | Kubota | G02B 1/111 |
| | | | 523/456 |
| 2013/0133739 A1* | 5/2013 | Kohnke | H01L 31/0216 |
| | | | 136/256 |
| 2013/0286659 A1 | 10/2013 | Lee et al. | |

FOREIGN PATENT DOCUMENTS

| | | |
|---|---|---|
| JP | 02191694 | 7/1990 |
| JP | 02196885 | 8/1990 |
| JP | 02250292 | 10/1990 |
| JP | 02255789 | 10/1990 |
| JP | 02289676 | 11/1990 |
| JP | 03296595 | 12/1991 |
| JP | 04096990 | 3/1992 |
| JP | 05-009470 | 1/1993 |
| JP | 05-017764 | 1/1993 |
| JP | 05-202011 | 8/1993 |
| JP | 06-049079 | 2/1994 |
| JP | 06049074 | 2/1994 |
| JP | 06-088072 | 3/1994 |
| JP | 06-100857 | 4/1994 |
| JP | 06092947 | 4/1994 |
| JP | 06107648 | 4/1994 |
| JP | 06-132080 | 5/1994 |
| JP | 06145146 | 5/1994 |
| JP | 06-203963 | 7/1994 |
| JP | 06-207170 | 7/1994 |
| JP | 06206865 | 7/1994 |
| JP | 06279322 | 10/1994 |
| JP | 06279323 | 10/1994 |
| JP | 06293778 | 10/1994 |
| JP | 07-157473 | 6/1995 |
| JP | 07-179394 | 7/1995 |
| JP | 07-228579 | 8/1995 |
| JP | 07-278124 | 10/1995 |
| JP | 08-022557 | 1/1996 |
| JP | 08-081472 | 3/1996 |
| JP | 2597377 B2 | 4/1997 |
| JP | 2012-43754 A | 3/2012 |
| JP | 2012-69257 A | 4/2012 |
| KR | 1020090019752 | 2/2009 |
| KR | 1020100063729 | 6/2010 |
| KR | 10-1114916 B1 | 2/2012 |
| KR | 101114352 | 2/2012 |
| KR | 101114916 | 2/2012 |
| KR | 1020120024510 | 3/2012 |
| TW | 201203649 A1 | 1/2012 |
| WO | 2009/028456 A1 | 3/2009 |
| WO | 2011-099641 A1 | 8/2011 |
| WO | 2011/126097 A1 | 10/2011 |

* cited by examiner

SUBSTRATE FOR ORGANIC ELECTRONIC DEVICE

This application is a Continuation Bypass of International Application No. PCT/KR2013/006909, filed Jul. 31, 2013, and claims the benefit of Korean Application Nos. 10-2012-0084211 and 10-2013-0091010, filed on Jul. 31, 2012, and Jul. 31, 2013, respectively, all of which are hereby incorporated by reference in their entirety for all purposes as if fully set forth herein.

TECHNICAL FIELD

The present application relates to a substrate for an organic electronic device (OED).

BACKGROUND ART

An OED may be a device exhibiting its functions through exchange of charges between an electrode layer and an organic material. The OED may be an organic light emitting device (OLED), an organic solar cell, an organic photo conductor (OPC), or an organic transistor.

Conventionally, an OLED, which is a representative OED, sequentially includes a substrate, a first electrode layer, an organic layer including an emitting layer, and a second electrode layer.

In a structure known as a bottom emitting device, the first electrode layer may be formed as a transparent electrode layer, and the second electrode layer may be formed as a reflective electrode layer. In addition, in a structure known as a top emitting device, the first electrode layer may be formed as a reflective electrode layer, and the second electrode layer may be formed as a transparent electrode layer.

Electrons and holes are each injected by the two electrode layers, and recombined in the emitting layer, resulting in generating light. The light may be emitted to the substrate in the bottom emitting device, or to the second electrode layer in the top emitting device.

In the structure of the OLED, indium tin oxide (ITO) generally used as the transparent electrode layer, an organic layer, and a substrate which is conventionally formed of glass, have refractive indexes of approximately 2.0, 1.8, and 1.5, respectively. In such a relationship of the refractive index, for example, the light generated in the organic emitting layer in the bottom emitting device is trapped at an interface between the organic layer and the first electrode layer or in the substrate due to total internal reflection, and only a very small amount of light is emitted.

DISCLOSURE

Technical Problem

The present application is directed to providing a substrate for an OED, and the OED.

Technical Solution

Figure 1:
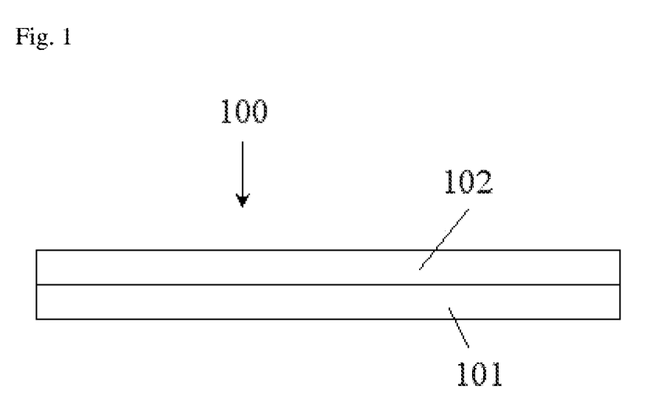
FIGS. 1 to 3 are schematic diagrams of an exemplary substrate.

One aspect of the present application provides a substrate for an OED, which includes: a base layer; and a planarization layer. For example, the planarization layer may be formed on the base layer. FIG. 1 shows an exemplary substrate 100 including a base layer 101 and a planarization layer 102 formed thereon. The term "planarization layer" used herein may refer to a layer capable of providing a planarized surface on which an OED can be formed. For example, an OED may be formed on a surface of the planarization layer opposite to a surface in contact with the base layer, and the surface may have a maximum height roughness of 1 or 0.5 µm or less. The maximum height roughness may refer to a distance between a line passing the highest point of a roughness curve and a line passing the lowest point, in which the lines are parallel to a central line in the roughness curve within a cut-off, and for example, a value measured with respect to an optional region having an area of 100 µm² on a planarized surface. For example, the planarization layer may be formed in contact with the base layer.

The planarization layer may be a high refractive layer. The term "high refractive layer" used herein may refer to a layer having a refractive index of approximately 1.8 to 2.5, 1.8 to 2.2, or 1.8 to 2.0. The term "refractive index" used herein may refer to, unless particularly defined otherwise, a refractive index with respect to a wavelength of approximately 550 or 633 nm. In addition, the planarization layer may have a light scattering property. That is, the planarization layer may scatter, diffuse, or refract incident light.

As the base layer, a suitable material may be used without particular limitation. For example, when a bottom emitting OLED is manufactured using a substrate, a transparent base layer, for example, a base layer having a transmittance with respect to light in a visible region of 50% or more may be used. As the transparent base layer, a glass base layer or a transparent polymer base layer may be used. As the glass base layer, a base layer including soda lime glass, barium/strontium-containing glass, lead glass, alumino silicate glass, borosilicate glass, barium borosilicate glass, or quartz may be used, and as the polymer base layer, a base layer including polyimide (PI), polyethylene naphthalate (PEN), polycarbonate (PC), an acryl resin, poly(ethylene terephthalate) (PET), poly(ether sulfide) (PES), or polysulfone (PS) may be used, but the present application is not limited thereto. As needed, the base layer may be a TFT substrate having a drive TFT.

For example, when a top emitting device is provided using a substrate, the base layer may not be necessarily a transparent base layer, and a reflective base layer having a reflective layer formed using aluminum on a surface of the base layer may be used as needed.

The planarization layer may include, for example, a binder, high refractive particles (hereinafter, referred to as "first particles"), and scattering particles (hereinafter, referred to as "second particles"). For example, the planarization layer may be formed using a composition prepared by mixing the first and second particles with the binder. Such a planarization layer may provide a surface on which an OED including an electrode layer may be formed, and improve light extraction efficiency of the device due to a light scattering property. In one example, the planarization layer may have a refractive index greater than or equal to that of an adjacent electrode layer, for example, 1.8 or more. The refractive index of the planarization layer may be, for example, 3.5 or less, 3.0 or less, 2.5 or less, or 2.0 or less.

Here, as the binder, a known material may be used without particular limitation. As the binder, for example, various organic binders, inorganic binders, or organic/inorganic binders known in the art may be used. In consideration of a lifespan of the device or excellent resistance to a high temperature process, a photo process, or an etching process, which is performed in a manufacturing process, an inorganic or organic/inorganic binder having excellent heat resistance and chemical resistance may be used, but when necessary, an organic binder may also be used. The binder may have, for example, a refractive index of approximately 1.4 or more, 1.45 or more, 1.5 or more, 1.6 or more, 1.65 or more, or 1.7 or more. The upper limit of the refractive index of the binder may be selected in the range of satisfying the refractive index of the planarization layer. As the binder, for example, polyimide, a caldo resin having a fluorene ring, urethane, an epoxide, polyester, or an acrylate-based heatcurable or photocurable monomeric, oligomeric, or polymeric organic material, an inorganic material such as silicon oxide, silicon nitride, silicon oxynitride, or polysiloxane, or an organic/inorganic combination material may be used.

For example, as the binder, polysiloxane, poly(amic acid), or polyimide may be used. Here, the polysiloxane may be formed by polycondensating, for example, a condensable silane compound or siloxane oligomer, and the binder may form a matrix based on a bond (Si—O) between silicon and oxygen. During the formation of the binder, the binder matrix based on the bond (Si—O) may be formed by controlling condensation conditions, or some of organic groups such as an alkyl group or condensable functional groups such as an alkoxy group may remain.

As the poly(amic acid) or polyimide binder, for example, a binder having a refractive index of approximately 1.5, 1.6, 1.65, or 1.7 or more with respect to light having a wavelength of 550 or 633 nm may be used. The poly(amic acid) or polyimide may be prepared using, for example, a monomer to which a halogen atom other than fluorine, a sulfur atom, or a phosphorus atom is introduced.

As the poly(amic acid) or polyimide binder, for example, a binder having a refractive index of approximately 1.5, 1.6, 1.65 or 1.7 or more with respect to light having a wavelength of 550 or 633 nm may be used. The poly(amic acid) or polyimide may be prepared using, for example, a monomer to which a halogen atom other than fluorine, a sulfur atom or a phosphorus atom is introduced.

As the binder, for example, a poly(amic acid) capable of enhancing dispersion stability of particles due to the presence of a part capable of binding with the particles such as a carboxylic group may be used.

As the poly(amic acid), for example, a compound including a repeating unit of Formula 1 may be used.

In Formula 1, n is a positive number.

The repeating unit may be optionally substituted with at least one substituent. As the substituent, a functional group including a halogen atom other than fluorine, a halogen atom such as a phenyl group, a benzyl group, a naphthyl group, or a thiophenyl group, a sulfur atom, or a phosphorus atom may be used.

The poly(amic acid) may be a homopolymer formed only using the repeating unit of Formula 1, or a copolymer including another unit with the repeating unit of Formula 1. In the copolymer, the kind or ratio of another repeating unit may be suitably selected in the range in which, for example, a desired refractive index, heat resistance, or light transmittance is not inhibited.

As a specific example of the repeating unit of Formula 1, a repeating unit of Formula 2 may be used.

[Formula 2]

In Formula 2, n is a positive number.

The poly(amic acid) may have a weight average molecular weight converted by standard polystyrene measured by gel permeation chromatography (GPC) of approximately 10,000 to 100,000 or 10,000 to 50,000. The poly(amic acid) having the repeating unit of Formula 1 may also have light transmittance in a visible region of 80, 85, or 90% or more, and have excellent heat resistance.

As the binder, a high refractive binder or a low refractive binder may be used. The term "high refractive binder" used herein may refer to a binder having a refractive index of approximately 1.7 to 2.5, or 1.7 to 2.0, and the term "low refractive binder" used herein may refer to a binder having a refractive index of approximately 1.4 or more and less than 1.7. Various kinds of the binders are known in the art, and suitable one may be selected from various kinds of the above-described binders and other known binders to use.

The planarization layer may include high refractive particles (first particles). The term "high refractive particles" used herein may refer to particles, for example, having a refractive index of 1.5, 1.8, 2.0, 2.2, 2.5, 2.6, or 2.7 or more. The upper limit of the refractive index of the high refractive particles may be selected in the range satisfying the refractive index of the planarization layer in consideration of, for

[Formula 1]

example, the refractive index of the binder blended therewith. The high refractive particles may have, for example, a smaller average diameter than that of scattering particles (second particles) to be described later. For example, the high refractive particles may have an average diameter to such an extent that light may not be scattered. For example, the high refractive particles may have an average diameter of approximately 100, 90, 80, 70, 60, 50, or 45 nm or less. In addition, the average diameter of the high refractive particles (first particles) may be, for example, 1, 5, or 10 nm or more. As the high refractive particles, alumina, alumino silicate, titanium oxide, or zirconium oxide may be used. As the high refractive particles, for example, particles having a refractive index of more than 2.3, or 2.4 or 2.5 or more, or approximately 2.5 to 3.0, a rutile-type titanium oxide may be used. When the rutile-type titanium oxide is used, even if a content of the high refractive particles in the material is relatively small, a planarization layer having a high refractive index may be embodied.

A ratio of the high refractive particles (first particles) in the planarization layer is not particularly limited, and may be controlled within a range in which the above-described refractive index of the planarization layer may be ensured. In consideration of physical properties of the planarization layer, for example, a moisture or vapor permeability of the planarization layer or outgassing, the high refractive particles (first particles) may be included in the planarization layer at 300, 250, 200, 150, or 120 parts by weight or less with respect to 100 parts by weight of the binder. In addition, the ratio of the first particles may be, for example, 40, 60, 80, 90, or 100 parts by weight or more. The units "parts by weight" used herein refer to, unless particularly defined otherwise, a weight ratio between components. As the ratios of the binder and the first particles are maintained as described above, for example, when the OED is formed, external quantum efficiency is increased, penetration of a gas or moisture from an external environment is prevented, and the outgassing is reduced, thereby providing the device having excellent performance and reliability.

The planarization layer may further include scattering particles (second particles). The term "scattering particles" used herein may refer to particles capable of scattering, refracting, or diffusing incident light since they have a different refractive index from the binder of the planarization layer and a suitable size. For example, the second particles may have a lower refractive index than the planarization layer or a mixture of the binder and the first particles. For example, the scattering particles may have a refractive index of approximately 0.5 to 2.0, 0.5 to 1.5, or 0.8 to 1.5. The second particles may have a difference in a refractive index with the planarization layer (or the mixture of the binder and the first particles) of approximately 0.8 or 0.7 or less. For example, the difference in the refractive index with the planarization layer (or the mixture of the binder and the first particles) may be, for example, approximately 0.2 or 0.4 or more. In addition, the scattering particles may have an average diameter of, for example, approximately 100 nm or more, or more than 100 nm, or 100 to 20,000, 100 to 15,000, 100 to 10,000, 100 to 5,000, 100 to 1,000, or 100 to 500 nm. The scattering particles may have a spherical, oval, polygonal, or amorphous shape, but the shape is not particularly limited. As the scattering particles, for example, particles including an organic material such as polystyrene or a derivative thereof, an acryl resin or a derivative thereof, a silicon resin or a derivative thereof, or a novolac resin or a derivative thereof, or an inorganic material such as silica, alumina, titanium oxide, or zirconium oxide may be used. The scattering particles may include any one of the above materials, or at least two thereof. For example, as the scattering particles, hollow particles such as hollow silica or particles having a core/shell structure may also be used.

Such scattering particles may be included in an amount of, for example, 10 to 100 parts by weight with respect to 100 parts by weight of the binder, and a suitable scattering characteristic may be ensured within such a ratio.

The planarization layer may be formed by a wet coating or sol-gel method using a coating solution including the binder, the scattering particles (second particles), and the high refractive particles (first particles).

In the planarization layer, a ratio (A/B) of a weight (A) of the high refractive particles (first particles) to a weight (B) of the scattering particles (second particles) may be, for example, approximately 0.9 to 8, 1 to 8, or 1 to 7.

In the planarization layer, a ratio ((A+B)/C) of a sum (A+B) of the weight (A) of the high refractive particles (first particles) and the weight (B) of the scattering particles (second particles) to a weight (C) of the binder may be, for example, approximately 1 to 5, 1 to 4.5, 1 to 4, 1.2 to 4.0, 1.2 to 3.8, 1.2 to 3.6, 1.2 to 3.4, 1.2 to 3.2, or 1.2 to 3.0. Within such a range, the scattering characteristic and other required physical properties of the planarization layer may be excellently maintained.

The ratio of the binder, the first particles, and the second particles may be changed by considering, for example, the refractive index of the binder used herein. For example, the planarization layer may include the low refractive binder, and in this case, the ratio ((A+B)/C) of a sum (A+B) of the weight (A) of the high refractive particles (first particles) and the weight (B) of the scattering particles (second particles) to a weight (C) of the binder may be, for example, approximately 2 to 5. In addition, when the planarization layer includes the above-described high refractive binder, the ratio ((A+B)/C) of the sum (A+B) of the weight (A) of the high refractive particles (first particles) and the weight (B) of the scattering particles (second particles) to the weight (C) of the binder may be 1 to 2, or 1 or more and less than 2. In this range, the physical properties, for example, a refractive index or durability, of the planarization layer may be maintained at a suitable level.

The planarization layer may further include particles having a higher refractive index than the planarization layer (or the mixture of the binder and the first particles) as scattering particles. For example, particles having a higher refractive index than the planarization layer within the range of approximately 2.1 to 3.5 or 2.2 to 3.0 may be further included as the scattering particles. Such scattering particles may have a difference in a refractive index with the planarization layer (or the mixture of the binder and the first particles) of approximately more than 0.8. The difference in the refractive index with the planarization layer (or the mixture of the binder and the first particles) may be, for example, approximately 1.5 or 1.0 or less. Such scattering particles may have an average diameter of, for example, approximately 100 nm or more, or more than 100 nm, or 100 to 20,000 nm, 100 to 15,000 nm, 100 to 10,000 nm, 100 to 5,000 nm, 100 to 1,000 nm, or 100 to 500 nm. As such particles, for example, particles including an organic material such as polystyrene or a derivative thereof, an acryl resin or a derivative thereof, a silicon resin or a derivative thereof, or a novolac resin or a derivative thereof, or an inorganic material such as silica, alumina, titanium oxide, or zirconium oxide may be used.

The planarization layer may be formed by, for example, a wet coating method using a coating solution including a binder, scattering particles, and high refractive particles, a sol-gel method, a deposition method such as chemical vapor deposition (CVD) or physical vapor deposition (PVD), or a microembossing method.

The substrate may further include an electrode layer. For example, the electrode layer may be formed on the planarization layer, and in contact with the planarization layer. As the electrode layer, for example, a conventional hole injection or electron injection electrode layer used to manufacture an OED such as an OLED may be formed.

The hole injection electrode layer may be formed using, for example, a material having a relatively high work function, and when necessary, using a transparent material. For example, the hole injection electrode layer may include a metal, alloy, electroconductive compound having a work function of approximately 4.0 eV or more, or a mixture of at least two thereof. Such a material may be a metal such as gold, CuI, ITO, indium zinc oxide (IZO), zinc tin oxide (ZTO), aluminum, or indium-doped zinc oxide, magnesium indium oxide, nickel tungsten oxide, an oxide material such as ZnO, $SnO_2$ or $In_2O_3$, a metal nitride such as gallium nitride, a metal selenide such as zinc selenide, or a metal sulfide such as zinc sulfide. A transparent hole injection electrode layer may also be formed using a stacked structure of a metal thin film such as Au, Ag, or Cu and a high refractive transparent material such as ZnS, $TiO_2$, or ITO.

The hole injection electrode layer may be formed by optional means such as deposition, sputtering, chemical deposition, or electrochemical means. In addition, as needed, the formed electrode layer may be patterned by a process using known photolithography or a shadow mask. A thickness of the hole injection electrode layer is different according to a light transmittance or surface resistance, but conventionally, may be within a range of 500 nm or 10 to 200 nm.

The electron injection transparent electrode layer may be formed using, for example, a transparent material having a relatively small work function, and for example, using a suitable one of materials used to form the hole injection electrode layer, but the present application is not limited thereto. The electron injection electrode layer may be formed using, for example, deposition or sputtering, and when needed, suitably patterned. The electron injection electrode layer may be formed to a suitable thickness as needed.

When the electrode layer is formed, the planarization layer may have a smaller projected area than the electrode layer. In this case, the planarization layer may have a smaller projected area than the base layer. The term "projected area" used herein refers to a projected area of a target recognized by observing the substrate above or below in a direction parallel to a normal direction of a surface of the substrate, for example, the base layer, planarization layer, or electrode layer. Accordingly, for example, even though a substantial surface area of the planarization layer is larger than that of the electrode layer due to an uneven surface of the planarization layer, when the area recognized by observing the planarization layer from above is smaller than that recognized by observing the electrode layer from above, it is construed that the planarization layer has a smaller projected area than the electrode layer.

The planarization layer may be present in various shapes as long as it has a smaller projected area than the base layer, and a smaller projected area than the electrode layer. For example, a planarization layer 102 may be formed only in a part excluding an edge of the base layer 101 as shown in FIG. 2, or a part of the planarization layer may be present at the edge of the base layer.

Figure 2:
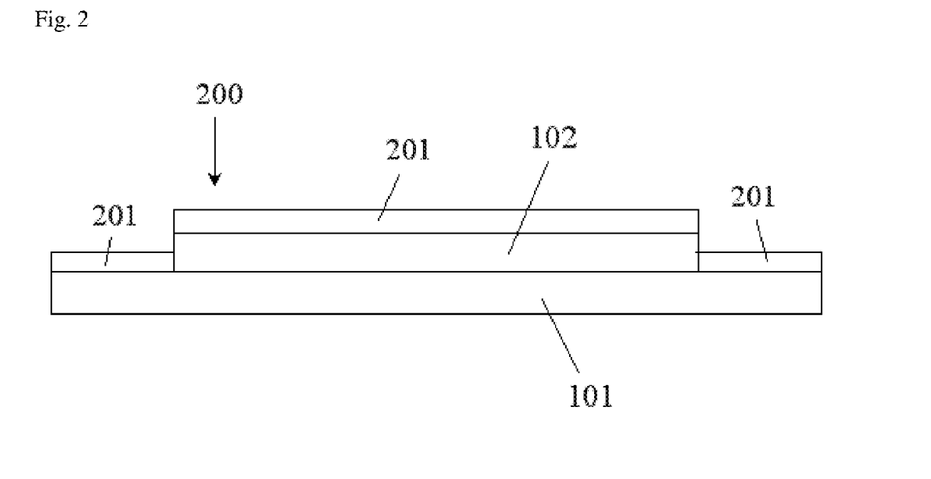
Figure 3:
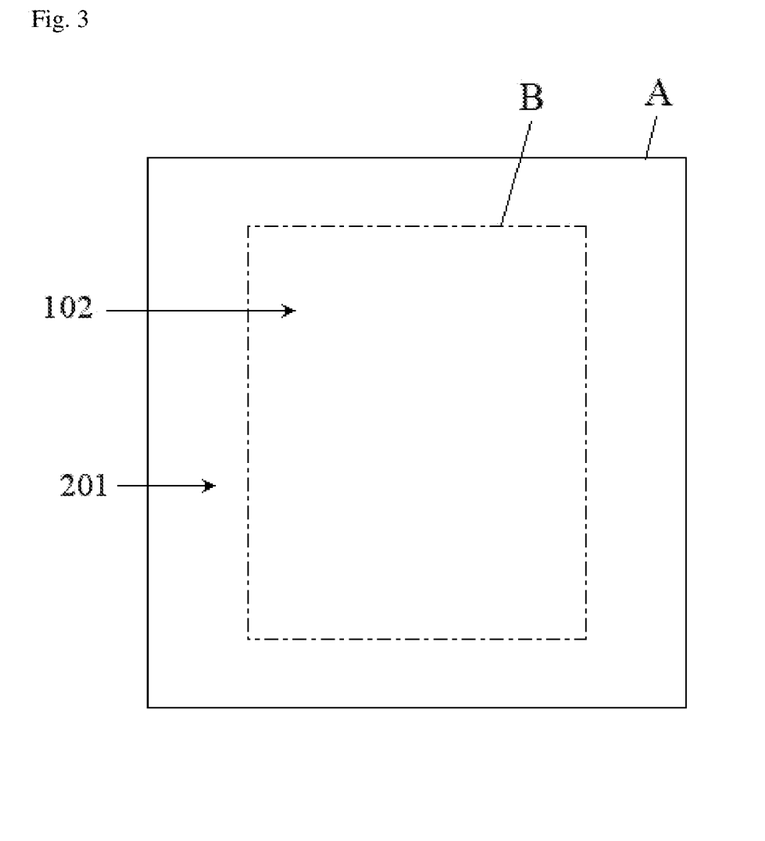

FIG. 3 is a diagram of the substrate of FIG. 2 observed from above. As show in FIG. 2, an area (A) of an electrode layer 201 recognized by observing the substrate from above, that is a projected area (A) of the electrode layer 201, is larger than a projected area (B) of the planarization layer 102 formed below the electrode layer. A ratio (A/B) of a projected area (A) of the electrode layer 201 to a projected area (B) of the planarization layer 102 or scattering layer may be, for example, 1.04, 1.06, 1.08, 1.1, or 1.15 or more. Since a structure in which a planarization layer to be described later is not exposed to an external environment if the projected area of the planarization layer is smaller than that of the electrode layer, the upper limit of the ratio (A/B) of the projected area is not particularly limited. In consideration of a manufacturing environment of a general substrate, the upper limit of the ratio (A/B) may be, for example, approximately 2.0, 1.5, 1.4, 1.3, or 1.25. In the substrate, the electrode layer may also be formed above the base layer on which the planarization layer is not formed. The electrode layer may be formed in contact with the base layer, or may be formed by including an additional factor between the electrode layer and the base layer. According to such a structure, a structure in which the planarization layer is not exposed to an external environment in realization of an OED may be embodied.

For example, as shown in FIG. 3, the electrode layer 201 may be formed to a region including a region out of all peripheral parts of the planarization layer 102 when observed from above. In this case, for example, an electrode layer may be formed to a region including a region out of all peripheral parts of at least one planarization layer, for example, a planarization layer on which an organic layer will be formed, when plural planarization layers are present on the base layer. In the above structure, a structure in which the planarization layer is not exposed to an external environment by a method of attaching an encapsulating structure to be described below to an electrode layer below which a planarization layer is not formed may be formed. Accordingly, it is prevented that the planarization layer becomes a penetration path of external moisture or oxygen, adhesive strength between an encapsulating structure or an electrode and the substrate may be stably ensured, and a surface hardness of an outer part of the device may be excellently maintained.

Another aspect of the present application provides an organic electronic system. The exemplary organic electronic system may include a substrate for an OED, and an OED formed on the substrate, for example, on a planarization layer of the substrate. The OED may include, for example, a first electrode layer, an organic layer, and a second electrode layer, which are sequentially formed on the planarization layer. In one example, the OED may be an OLED. When the OED is an OLED, the OED may have, for example, a structure in which an organic layer including at least an emitting layer is intermediated between a hole injection electrode layer and an electron injection electrode layer. The hole injection electrode layer or the electron injection electrode layer may be an electrode layer on the planarization layer of the substrate described above.

In the OLED, the organic layer present between the electron and hole injection electrode layers may include at least one emitting layer. The organic layer may include multiple, that is, at least two emitting layers. When the at least two emitting layers are included, the emitting layers may have a structure divided by an inter-electrode having a charge generating characteristic or a charge generating layer (CGL), but the present application is not limited thereto.

The emitting layer may be formed using, for example, various fluorescent or phosphorescent organic materials known in the art. An example of the material capable of being used in the emitting layer may be, but is not limited to, an Alq-based material such as tris(4-methyl-8-quinolinolate) aluminum(III) (Alg3), 4-MAlq3, or Gaq3; a cyclopentadiene derivative such as C-545T($C_{26}H_{26}N_2O_2S$), DSA-amine, TBSA, BTP, PAP-NPA, spiro-FPA, $Ph_3Si$ (PhTDAOXD), 1,2,3,4,5-pentaphenyl-1,3-cyclopentadiene (PPCP); 4,4'-bis (2,2'-diphenylvinyl)-1,1'-biphenyl (DPVBi), distyrylbenzene, or a derivative thereof; 4-(dicyanomethylene)-2-tert-butyl-6-(1,1,7,7,-tetramethyljulolidyl-9-enyl)-4H-pyran (DCJTB), DDP, AAAP or NPAMLI; or a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bpy)$, $F_2Ir(acac)$, $op_2Ir(acac)$, $PPy_2Ir(acac)$, $tpy_2Ir(acac)$, fac-tris[2-(4,5'-difluorophenyl)pyridine-C'2,N] iridium(III) (FIrppy), or bis(2-(2'-benzo[4,5-a]thienyl)pyridinato-N,C3') iridium(acetylactonate) ($Btp_2Ir(acac)$). The emitting layer may include the material as a host, and a host-dopant system including perylene, distyrylbiphenyl, DPT, quinacridone, rubrene, BTX, ABTX, or DCJTB as a dopant.

The emitting layer may also be formed by employing one suitable type selected from electron accepting organic compounds or electron donating organic compounds exhibiting excellent emitting characteristics, which will be described later.

The organic layer may be formed in various structures further including various functional layers known in the art, as long as it includes the emitting layer. As a layer capable of being included in the organic layer, an electron injection layer, a hole blocking layer, an electron transport layer, a hole transport layer, or a hole injection layer may be used.

The electron injection layer or electron transport layer may be formed using, for example, an electron accepting organic compound. Here, as the electron accepting organic compound, a known optional compound may be used without particular limitation. As such an organic compound, a polycyclic compound such as p-terphenyl or quaterphenyl or a derivative thereof; a polycyclic hydrocarbon compound such as naphthalene, tetracene, pyrene, coronene, chrysene, anthracene, diphenylanthracene, naphthacene, or phenanthrene or a derivative thereof; or a heterocyclic compound such as phenanthroline, bathophenanthroline, phenanthridine, acridine, quinoline, quinoxaline, or phenazine or a derivative thereof. In addition, fluoroceine, perylene, phthaloperylene, naphthaloperylene, perynone, phthaloperynone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone, rubrene or a derivative thereof, a metal chelate complex compound disclosed in a patent publication such as Japanese Laid-Open Patent Application No. 1988-295695, Japanese Laid-Open Patent Application No. 1996-22557, Japanese Laid-Open Patent Application No. 1996-81472, Japanese Laid-Open Patent Application No. 1993-009470, or Japanese Laid-Open Patent Application No. 1993-017764, for example, a metal complex having at least one of metal chelated oxinoid compounds such as 8-quinolatos including tris(8-quinolinolato)aluminum, bis(8-quinolinolato)magnesium, bis[benzo(f)-8-quinolinolato]zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, and derivatives thereof as a coordinator; an oxadiazole compound disclosed in a patent publication such as Japanese Laid-Open Patent Application No. 1993-202011, Japanese Laid-Open Patent Application No. 1995-179394, Japanese Laid-Open Patent Application No. 1995-278124, or Japanese Laid-Open Patent Application No. 1995-228579; a triazine compound disclosed in a patent publication such as Japanese Laid-Open Patent Application No. 1995-157473; a stilbene derivative disclosed in a patent publication such as Japanese Laid-Open Patent Application No. 1994-203963; a distyrylarylene derivative; a styryl derivative disclosed in a patent publication such as Japanese Laid-Open Patent Application No. 1994-132080 or Japanese Laid-Open Patent Application No. 1994-88072; a diolefin derivative disclosed in a patent publication such as Japanese Laid-Open Patent Application No. 1994-100857 or Japanese Laid-Open Patent Application No. 1994-207170; a fluorescent brightening agent such as a benzooxazole compound, a benzothiazole compound, or a benzoimidazole compound; a distyrylbenzene compound such as 1,4-bis(2-methylstyryl)benzene, 1,4-bis(3-methylstyryl)benzene, 1,4-bis(4-methylstyryl)benzene, distyrylbenzene, 1,4-bis(2-ethylstyryl)benzyl, 1,4-bis(3-ethylstyryl)benzene, 1,4-bis(2-methylstyryl)-2-methylbenzene, or 1,4-bis(2-methylstyryl)-2-ethylbenzene; a distyrylpyrazine compound such as 2,5-bis(4-methylstyryl) pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl]pyrazine, or 2,5-bis[2-(1-pyrenyl) vinyl]pyrazine; a dimethylidine compound such as 1,4-phenylenedimethylidene, 4,4'-phenylenedimethylidene, 2,5-xylene dimethylidene, 2,6-naphthylenedimethylidene, 1,4-biphenylenedimethylidene, 1,4-para-terephenylene dimethylidene, 9,10-anthracenediyldimethylidine, or 4,4'-(2,2-di-ti-butylphenylvinyl)biphenyl, 4,4'-(2,2-diphenylvinyl) biphenyl or a derivative thereof; a silanamine derivative disclosed in a patent publication such as Japanese Laid-Open Patent Application No. 1994-49079 or Japanese Laid-Open Patent Application No. 1994-293778; a multifunctional styryl compound disclosed in a patent publication such as Japanese Laid-Open Patent Application No. 1994-279322 or Japanese Laid-Open Patent Application No. 1994-279323; an oxadiazole derivative disclosed in a patent publication such as Japanese Laid-Open Patent Application No. 1994-107648 or Japanese Laid-Open Patent Application No. 1994-092947; an anthracene compound disclosed in a patent publication such as Japanese Laid-Open Patent Application No. 1994-206865; an oxynate derivative disclosed in a patent publication such as Japanese Laid-Open Patent Application No. 1994-145146; a tetraphenyl butadiene compound disclosed in a patent publication such as Japanese Laid-Open Patent Application No. 1992-96990; an organic trifunctional compound disclosed in a patent publication such as Japanese Laid-Open Patent Application No. 1991-296595; a coumarin derivative disclosed in a patent publication such as Japanese Laid-Open Patent Application No. 1990-191694; a perylene derivative disclosed in a patent publication such as Japanese Laid-Open Patent Application No. 1990-196885; a naphthalene derivative disclosed in a patent publication such as Japanese Laid-Open Patent Application No. 1990-255789; a phthaloperynone derivative disclosed in a patent publication such as Japanese Laid-Open Patent Application No. 1990-289676 or Japanese Laid-Open Patent Application No. 1990-88689; or a styryl amine derivative disclosed in a patent publication such as Japanese Laid-Open Patent Application No. 1990-250292 may be used as an electron accepting organic compound included in the low refractive layer. In addition, here, the electron injection layer may be formed using, for example, a material such as LiF or CsF.

The hole blocking layer may be a layer capable of enhancing a lifespan and efficiency of the device by preventing approach of holes injected from a hole injection electrode to an electron injection electrode through the emitting layer, and may be formed in a suitable part between the emitting layer and the electron injection electrode using a known material when necessary.

The hole injection layer or hole transport layer may include, for example, an electron donating organic compound. As the electron donating organic compound, N,N',N'-tetraphenyl-4,4'-diaminophenyl, N,N'-diphenyl-N,N'-di(3-methylphenyl)-4,4'-diaminobiphenyl, 2,2-bis(4-di-p-tollylaminophenyl)propane, N,N,N',N'-tetra-p-tollyl-4,4'-diaminobiphenyl, bis(4-di-p-tollylaminophenyl)phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino)quadriphenyl, 4-N,N-diphenylamino-(2-diphenylvinyl)benzene, 3-methoxy-4'-N,N-diphenylaminostyrylbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tollyl)amine, 4-(di-p-tollylamino)-4'-[4-(di-p-tollylamino)styryl]stilbene, N,N,N',N'-tetraphenyl-4,4'-diaminobiphenyl N-phenylcarbazole, 4,4'-bis[N-(1-naphthyl)-N-phenylamino]biphenyl, 4,4''-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenylphenylamino]biphenyl, 4,4''-bis[N-(1-anthryl)-N-phenylamino]-p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tollylamino)naphthalene, 2,6-bis[di-(1-naphthyl)amino]naphthalene, 2,6-bis[N-(1-naphthyl)-N-(2-naphthyl)amino]naphthalene, 4,4''-bis[N,N-di(2-naphthyl)amino]terphenyl, 4,4'-bis{N-phenyl-N-[4-(1-naphthyl)phenyl]amino}biphenyl, 4,4'-bis[N-phenyl-N-(2-pyrenyl)amino]biphenyl, 2,6-bis[N,N-di-(2-naphthyl)amino]fluorene, or 4,4'-bis(N,N-di-p-tollylamino)terphenyl, or an aryl amine compound such as bis(N-1-naphthyl)(N-2-naphthyl)amine may be used, but the present application is not limited thereto.

The hole injection layer or hole transport layer may be formed by dispersing the organic compound in a polymer, or using a polymer derived from the organic compound. In addition, a π-Conjugated polymer such as polyparaphenylenevinylene and a derivative thereof, a hole transport non-conjugated polymer such as poly(N-vinylcarbazole), or a σ-conjugated polymer of polysilane may also be used.

The hole injection layer may be formed using an electrically-conductive polymer such as a metal phthalocyanine such as copper phthalocyanine or a non-metal phthalocyanine, a carbon layer, and polyaniline, or may be formed by reaction with a Lewis acid using the aryl amine compound as an oxidizing agent.

For example, the OLED may be formed in a type of (1) a hole injection electrode layer/an organic emitting layer/an electron injection electrode layer; (2) a hole injection electrode layer/a hole injection layer/an organic emitting layer/an electron injection electrode layer; (3) a hole injection electrode layer/an organic emitting layer/an electron injection layer/an electron injection electrode layer; (4) a hole injection electrode layer/a hole injection layer/an organic emitting layer/an electron injection layer/an electron injection electrode layer; (5) a hole injection electrode layer/an organic semiconductor layer/an organic emitting layer/an electron injection electrode layer; (6) a hole injection electrode layer/an organic semiconductor layer/an electron barrier layer/an organic emitting layer/an electron injection electrode layer; (7) a hole injection electrode layer/an organic semiconductor layer/an organic emitting layer/an adhesion-improving layer/an electron injection electrode layer; (8) a hole injection electrode layer/a hole injection layer/a hole transport layer/an organic emitting layer/an electron injection layer/an electron injection electrode layer; (9) a hole injection electrode layer/an insulating layer/an organic emitting layer/an insulating layer/an electron injection electrode layer; (10) a hole injection electrode layer/an inorganic semiconductor layer/an insulating layer/an organic emitting layer/an insulating layer/an electron injection electrode layer; (11) a hole injection electrode layer/an organic semiconductor layer/an insulating layer/an organic emitting layer/an insulating layer/an electron injection electrode layer; (12) a hole injection electrode layer/an insulating layer/a hole injection layer/a hole transport layer/an organic emitting layer/an insulating layer/an electron injection electrode layer; or (13) a hole injection electrode layer/an insulating layer/a hole injection layer/a hole transport layer/an organic emitting layer/an electron injection layer/an electron injection electrode layer, which are sequentially formed from the planarization layer of the substrate, and in some cases, the OLED may have an organic layer having a structure in which at least two emitting layers are split by an inter-electrode layer having a charge generating characteristic or CGL between a hole injection electrode layer and an electron injection electrode layer, but the present application is not limited thereto.

Various materials for forming a hole or electron injection electrode layer and an organic layer, for example, an emitting layer, an electron injection or transport layer, or a hole injection or transport layer, and methods of forming the same are known in the art, and all of the above-described methods may be applied to manufacture the organic electronic system.

The organic electronic system may further include an encapsulating structure. The encapsulating structure may be a protective structure for preventing inflow of an external material such as moisture or oxygen to the organic layer of the organic electronic system. The encapsulating structure may be, for example, a can such as a glass can or metal can, or a film covering an entire surface of the organic layer.

Figure 4:
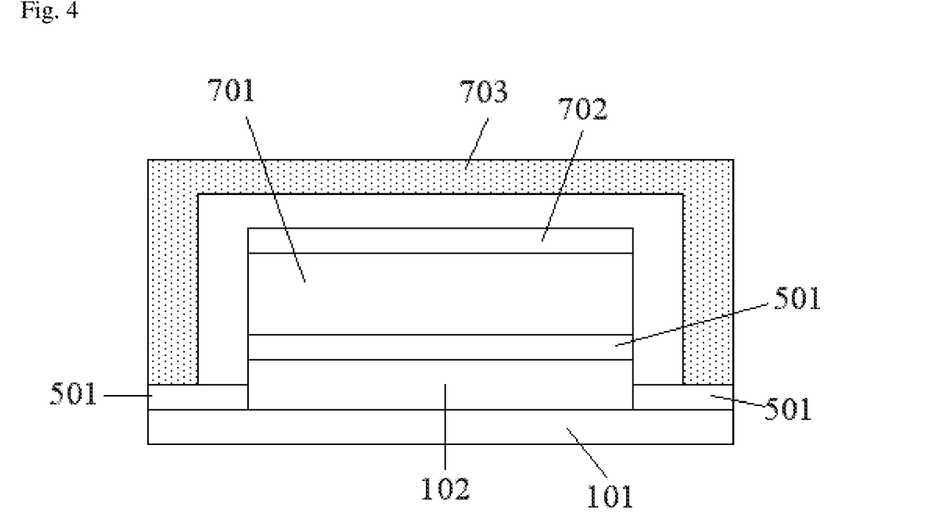
FIGS. 4 and 5 are diagrams of an exemplary organic electronic system.

FIG. 4 shows that an organic layer 701 and a second electrode layer 702 formed on a substrate including a base layer 101, a planarization layer 102, and a first electrode layer 501, which are sequentially formed, are protected by an encapsulating structure 703 formed in a can type such as a glass can or a metal can. For example, the encapsulating structure 703 of FIG. 4 may be attached by, for example, an adhesive. The encapsulating structure 703 may be adhered to, for example, the electrode layer 501 below which the planarization layer 102 is not present on the substrate. For example, like FIG. 2, the encapsulating structure 703 may be attached to an end of the substrate by an adhesive. According to such a method, a protecting effect by the encapsulating structure may be optimized.

Figure 5:
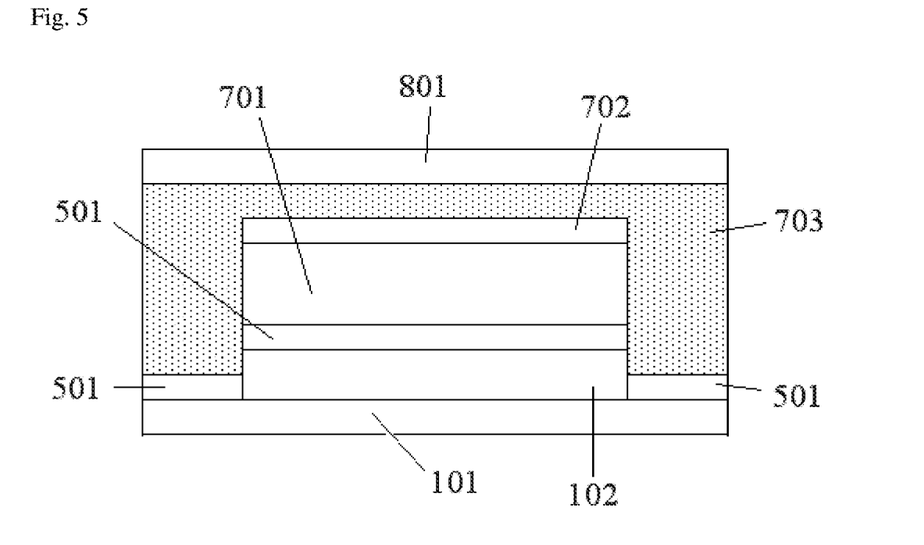

The encapsulating structure may be, for example, a film coating entire surfaces of the organic layer and the second electrode layer. FIG. 5 shows a film-type encapsulating structure 703 covering the entire surfaces of the organic layer 701 and the second electrode layer 702. For example, as shown in FIG. 5, the film-type encapsulating structure 703 may cover the entire surfaces of the organic layer 701 and the second electrode layer 702, and have a structure in which the substrate including the base layer 101, the planarization layer 102, and the electrode layer 501 is adhered to a second substrate 801 laid above. For example, as the second substrate 801, a glass substrate, a metal substrate, a polymer film, or a barrier layer may be used. The film-type encapsulating structure may be formed by, for example, coating a liquid material cured by heat or UV radiation such as an epoxy resin and curing the liquid material, or laminating the substrate with the upper substrate using an adhesive sheet previously manufactured in a film type using the epoxy resin.

The encapsulating structure may include a moisture adsorbent or getter such as a metal oxide such as calcium oxide or beryllium oxide, a metal halide such as calcium oxide, or phosphorus pentoxide, when necessary. For example, the moisture adsorbent or getter may be included in the film-type encapsulating structure, or present at a predetermined position of a can-type encapsulating structure. The encapsulating structure may further include a barrier film or a conductive film.

As shown in FIG. 4 or 5, the encapsulating structure may be attached to, for example, the top of the first electrode layer 501 below which the planarization layer 102 is not formed. Accordingly, a sealing structure in which the planarization layer is not exposed to an external environment may be embodied. The sealing structure may refer to, for example, a state in which the entire surface of the planarization layer is not exposed to an external environment by being surrounded by the base layer, the electrode layer, and/or the encapsulating structure, or by being surrounded by the sealing structure formed to include the base layer, the electrode layer, and/or the encapsulating structure. The sealing structure may be formed to only include the base layer, the electrode layer, and/or the encapsulating structure, or to include the base layer, the electrode layer, the encapsulating structure, and also another component, for example, an auxiliary electrode as long as the planarization layer is not exposed to an external environment. For example, in FIG. 4 or 5, another component may be present at a part in which the base layer 101 is in contact with the electrode layer 501 or a part in which the electrode layer 501 is in contact with the encapsulating structure 703, or another position. As another component, a low moisture permeable organic material, inorganic material, or organic/inorganic combination material, an insulating layer, or an auxiliary electrode may be used.

Still another aspect of the present application provides a use of the OED, for example, the OLED. The OLED may be effectively applied to a backlight of a liquid crystal display (LCD), lightings, sensors, a light source of a printer or copy machine, a light source for an automobile gauge, a signal light, a pilot lamp, a display device, a light source for a planar emitting device, a display, decorations, or other kinds of lights. In one embodiment, the present application relates to a lighting device including the OLED. When the OLED is applied to the lighting device or for different uses, other components constituting the device or a method of constituting the device is not particularly limited, but all of optional materials or methods known in the related art may be employed as long as these are used in the OLED.

Advantageous Effects

According to the present application, a substrate capable of forming an OED ensuring excellent performance and reliability since it has excellent performance including light extraction efficiency, penetration of moisture or a gas from an external environment is inhibited, and growth of dark spots is controlled can be provided.

| <Reference Numerals of Drawings> |
| --- |
| 100, 200: substrate for OED |
| 101: base layer |
| 102: planarization layer |
| 201: electrode layer |
| 501: first electrode layer |
| 701: organic layer |
| 702: second electrode layer |
| 703: encapsulating structure |
| 801: second substrate |

MODE FOR INVENTION

Hereinafter, the present application will be described in further detail with reference to Examples according to the present application and Comparative Examples not according to the present application, but the scope of the present application is not limited to the following Examples.

Example 1

As a binder, poly(amic acid) synthesized using a compound (3,3'-sulfonyldianiline) of Formula A and a compound (3,3',4,4'-bipheynyltetracarboxylic dianhydride) of Formula B by a known method of synthesizing poly(amic acid) and having a refractive index of approximately 1.7 to 1.8 was used, and a coating solution (binder:first particles:second particles=1:1.5:0.25 (weight ratio)) was prepared by blending hollow silica particles (a refractive index of a core: approximately 1.0, and a refractive index of a cell: approximately 1.5; second particles) having an average diameter of approximately 200 to 300 nm as scattering particles, and high refractive particles (rutile-type titanium oxide; first particles) having an average diameter of approximately 20 nm and a refractive index of approximately 2.6 into the binder. A planarization layer was formed by coating the prepared coating solution on a glass substrate. Afterward, a part of the planarization layer was removed by radiating a laser to the formed layer to correspond a position of the remaining planarization layer to an emitting region of an organic layer that will be subsequently formed. After the removal of the planarization layer, a hole injection electrode layer including ITO was formed to a predetermined thickness on an entire surface of the glass substrate by a known sputtering method. Subsequently, a device was manufactured by forming an organic layer capable of emitting white light on the ITO layer using known material and method, and forming an aluminum (Al) electrode as an electron injection reflective electrode on the top of the organic layer by a vacuum deposition method.

[Formula A]

-continued

[Formula B]

Example 2

A device was manufactured as described in Example 1, except that a ratio of a binder, and first and second particles was changed in the preparation of a coating solution (ratio after changing=binder:first particles:second particles=1:1: 0.8 (weight ratio)).

Comparative Example 1

A device was manufactured as described in Example 1, except that a ratio of a binder, and first and second particles was changed in the preparation of a coating solution (ratio after changing=binder:first particles:second particles=1:1: 1.4 (weight ratio)).

Experimental Example 1. Evaluation of Reliability of Device

Figure 6:
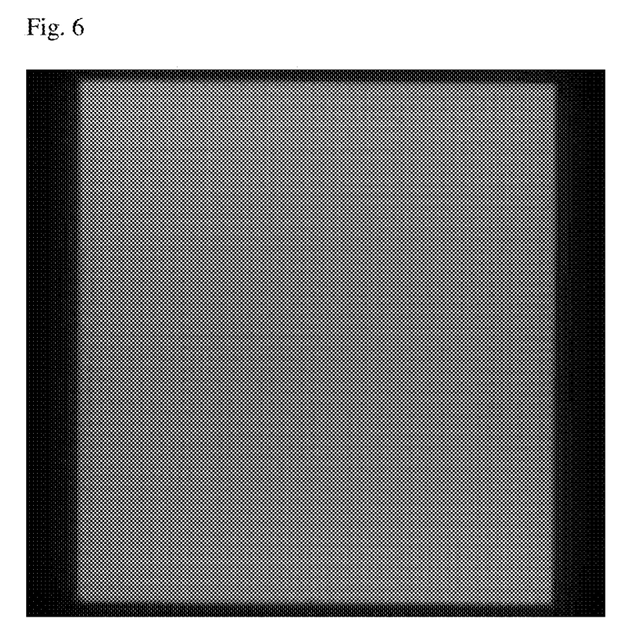
FIGS. 6 and 7 are diagrams showing emitting states according to Examples 1 and 2, respectively.
Figure 7:
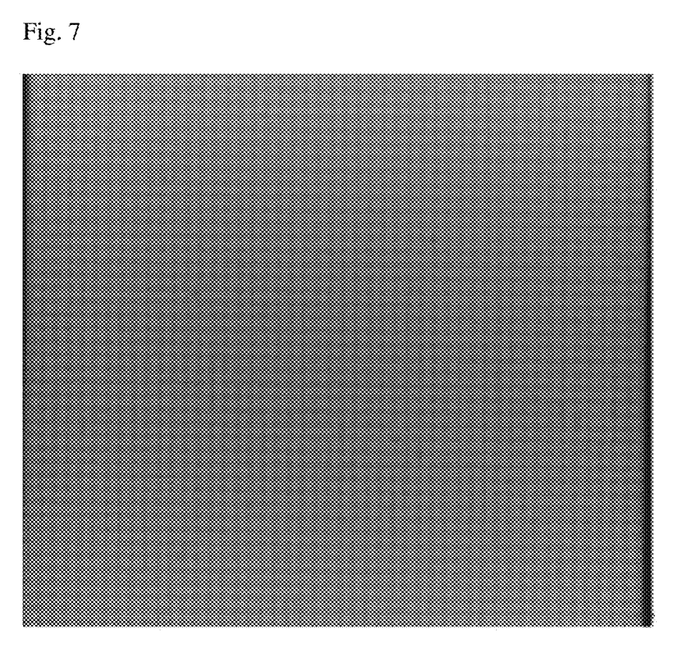
Figure 8:
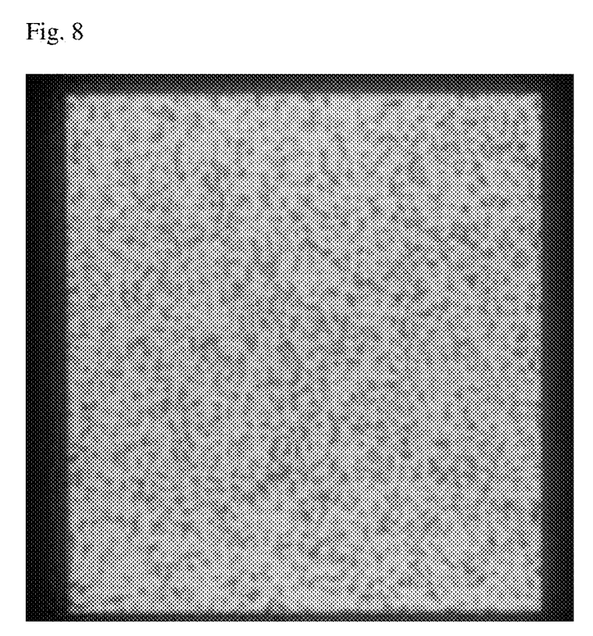
FIG. 8 is a diagram showing an emitting state according to Comparative Example 1.

FIGS. 6 and 7 are diagrams showing emitting states of the organic electronic systems according to Examples 1 and 2, respectively, and FIG. 8 is a diagram showing an emitting state according to Comparative Example 1. It can be confirmed from FIGS. 6 to 8 that several dot spots were observed from the device according to Comparative Example 1, and thus the device exhibited a poor emitting state, but no dot spot was observed from the devices according to Examples 1 and 2, and thus the devices were maintained in a stable emitting state.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A substrate for an organic electronic device, comprising:
a base layer; and
a planarization layer that is on the base layer and comprises a binder, a first particle, of which a refractive index is 1.8 or more and an average diameter is 50 nm or less, and a second particle, of which a refractive index is lower than a refractive indices of the binder and the first particle and an average diameter is from 100 nm to 500 nm, a ratio (A/B) of a weight (A) of the first particle and a weight (B) of the second particle being from 0.8 to 8,
wherein a surface of the planarization layer, opposite to a surface contacting with the base layer, has a maximum height roughness in a range of 1 μm or less.

2. The substrate according to claim 1, wherein the planarization layer is in contact with the base layer.

3. The substrate according to claim 1, wherein the first particle has a refractive index in the range of 2.2 or more.

4. The substrate according to claim 1, wherein a ratio ((A+B)/C) of the sum of the weight (A) of the first particle and the weight (B) of the second particle relative to a weight (C) of the binder is from 1 to 5.

5. The substrate according to claim 1, wherein the binder is polysiloxane, poly(amic acid), or polyimide.

6. The substrate according to claim 1, wherein the second particle is a hollow particle or a particle having a core/shell structure.

7. The substrate according to claim 1, wherein a refractive index of the binder is 1.4 or more and also less than 1.7.

8. The substrate according to claim 7, wherein a ratio ((A+B)/C) of the sum of the weight (A) of the first particle and the weight (B) of the second particle relative to the weight (C) of the binder is from 2 to 5.

9. The substrate according to claim 1, wherein a refractive index of the binder is 1.7 or more.

10. The substrate according to claim 9, wherein the ratio ((A+B)/C) of the sum of the weight (A) of the first particle and the weight (B) of the second particle relative to the weight (C) of the binder is 1 or more and also less than 2.

11. The substrate according to claim 1, further comprising an electrode layer on the planarization layer.

12. The substrate according to claim 11, wherein a projected area of the planarization layer is smaller than that of the electrode layer, and the electrode layer is formed on the planarization layer and on the base layer, below which the planarization layer is not formed.

13. An organic electronic device, comprising:
the substrate of claim 1; and
a first electrode layer, an organic layer comprising an emitting layer, and a second electrode layer, which are sequentially formed on the substrate.

14. The organic electronic system according to claim 13, wherein a projected area of the planarization layer of the substrate is smaller than that of the first electrode layer, and the first electrode layer is formed on the planarization layer and on the base layer, below which the planarization layer is not formed.

15. A light comprising the organic electronic device of claim 13.

* * * * *